United States Patent
Lou

(10) Patent No.: US 7,318,172 B2
(45) Date of Patent: Jan. 8, 2008

(54) WIRELESS REMOTE FIRMWARE DEBUGGING FOR EMBEDDED WIRELESS DEVICE

(75) Inventor: Wenkwei Lou, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 665 days.

(21) Appl. No.: 10/930,577

(22) Filed: Aug. 31, 2004

(65) Prior Publication Data

US 2006/0048006 A1 Mar. 2, 2006

(51) Int. Cl.
*G06F 11/00* (2006.01)
(52) U.S. Cl. .......................................... 714/25; 717/124
(58) Field of Classification Search ................... 714/25; 717/124; 455/41.2, 557
See application file for complete search history.

(56) References Cited

U.S. PATENT DOCUMENTS

| | | | |
|---|---|---|---|
| 6,895,530 B2 * | 5/2005 | Moyer et al. ................. | 714/25 |
| 6,915,416 B2 * | 7/2005 | Deng et al. ................. | 712/227 |
| 7,206,982 B1 * | 4/2007 | Patel et al. .................. | 714/724 |
| 7,216,257 B2 * | 5/2007 | Kilian ........................ | 714/31 |
| 2003/0056196 A1 * | 3/2003 | Kim et al. ................... | 717/124 |
| 2003/0120970 A1 * | 6/2003 | Chen .......................... | 714/25 |
| 2005/0102577 A1 * | 5/2005 | Liow et al. ................... | 714/37 |

* cited by examiner

*Primary Examiner*—Robert Beausoliel
*Assistant Examiner*—Philip Guyton

(57) ABSTRACT

A method for debugging a ROM in a wireless target device. After a wireless communication link is established with the target device by a host computer, a debug mode change command is transmitted to the target device by the host computer. The debug mode change command is received by the target device and a monitor program is enabled to parse the serial port. A debug instruction from a debugger in the host computer is then received by the monitor program where, the debug instruction includes an entry address and a jump address. The application program jumps to the received jump address upon reaching the entry address location in the application program. An acknowledgement package is transmitted to the debugger in the host computer, and a second debug instruction is received from the debugger, responsive to the acknowledgement package.

20 Claims, 7 Drawing Sheets

WIRELESS REMOTE FIRMWARE DEBUGGING FOR EMBEDDED WIRELESS DEVICE

FIELD OF THE INVENTION

The present invention relates generally to wireless devices; and more particularly to firmware debugging of wireless devices with its code stored in a read only memory (ROM).

BACKGROUND OF THE INVENTION

A principal aim in the debug process is to non-intrusively capture the activity of a microprocessor execution unit embedded in a device under test (DUT). Firmware development and debugging of the embedded microprocessor requires access to the firmware stored typically in a random access memory (RAM). The final code is then committed to a memory. Typically a read only memory (ROM) is used in embedded devices because ROM by nature is not changeable or editable, it takes up a smaller area than RAM, therefore it is quite common for embedded device to commit the firmware code to ROM once system testing has completed. To achieve a firmware debugging, a microprocessor must be controlled and observed via its external connections. However, access to a microprocessor that is deeply embedded within a DUT can only be achieved via the external pins of the densely packaged and typically high speed embedded device. Therefore embedded devices have made the traditional in-circuit emulator (ICE) ineffectual owing to the inaccessibility of the embedded microprocessor.

Moreover, since the code in the ROM cannot be altered, typically an image of the ROM is created in the RAM of the microprocessor by a debugger program and the image is used to perform firmware debugging. However, many embedded devices do not have adequate RAM space for storing the entire image of their ROM code.

Software break points (SWBP) provide another mechanism to allow the debug of microprocessor code and to evaluate performance. A SWBP is typically accomplished through code replacement, provided the program resides in a writable memory module (e.g., a RAM) which allows the code at the stop point to be replaced in memory with the software break point code. In most devices, when a SWBP code reaches an instruction execution, it causes the application program to stop advancing and sets a debug status bit indicating the application program has stopped. To restart execution, the application program can be restarted by simply refetching the code at the SWBP memory address after the code is replaced in memory with the original code.

However, firmware debugging of a wireless device in its final form is challenging due to lack of observability into the execution of the firmware code stored in a ROM of the wireless device. For example, to debug a Bluetooth device such as a Bluetooth keyboard or mouse, the serial port of the processor will have to be brought out to a typically nine-pin connector (e.g., a serial port, such as a universal asynchronous receiver transmitter (UART) connector) through which a serial port cable can then connect to a personal computer (PC) host which runs the debugger program. The debugger program then passes various commands to a small monitor program that resides in the embedded device to facilitate the controlled execution of the target firmware.

Thus, conventional methods for firmware debugging of a wireless device is intrusive and potentially destructive. Furthermore a test jig and/or opening of the DUT is needed to provide a debug interface to probe the execution of the firmware. The conventional methods also need to have large external RAM space to allow "von Neuman" structure. This means that access is possible from data and code space to the RAM.

Therefore, there is a need to a firmware debugging method and system for wireless devices that enables an efficient debugging of the DUT, without the need for opening of the DUT.

SUMMARY OF THE INVENTION

The present invention provides an improved method and apparatus for a firmware debugging of wireless devices using the existing wireless protocol stack to facilitate status/command communications between a host and DUT (target device). The method and apparatus of the present invention uses the on-device code patch resources to set break points and debug the ROM code.

In one embodiment the present invention is a method for debugging a ROM in a wireless target device running an application program and including a debug monitor program. After a wireless communication link is established with the target device by a host computer, a debug mode change command is transmitted to the target device by the host computer. The debug mode change command is received by the application program via a wireless serial port in the target device and the monitor program is enabled to parse the serial port. A debug instruction from a debugger in the host computer is then received by the monitor program where, the debug instruction includes an entry address and a jump address. The application program jumps to the received jump address upon reaching the entry address location in the application program. An acknowledgement package is transmitted to the debugger in the host computer, and a second debug instruction can be received from the debugger, responsive to the acknowledgement package.

DETAILED DESCRIPTION

In one embodiment, the present invention is a method and apparatus for a firmware debugging of wireless devices using the existing wireless protocol stack to facilitate status and command communications between the host and target device. The invention takes advantage of the 'air link' that is inherent in wireless, such as Bluetooth, devices to communicate commands and command status between a debugger residing in a host computer and the embedded target device.

In one embodiment, the emulated serial port in Bluetooth (RFCOMM) is used to pass debug commands (such as, set break point, single step, read memory, read register, write memory, etc.) to a monitor program residing in the target device. The monitor program receives the debug commands from the host through the RFCOMM serial port and executes the debug commands and returns status to the host via the serial port.

For example, to set a break point in an application program that is being debugged, a user double clicks on a code line in the debugger running on the host, the debugger then sends a break command via the RFCOMM serial channel application programming interface (API), the command and the instruction address are encapsulated into a packet and sent out via the Bluetooth RF link. The target device RFCOMM peer receives this command and passes the command to the monitor program that is running in the target device. The monitor program upon receiving this command, modifies the patch entry in the ROM and directs (jumps) the break address once the application program reaches the break point. The monitor program detects that a break has occurred and sends a break response status to the local RFCOMM which then sends a break status packet back to the host. The host receives this response packet and notifies the debugger of the break status. The debugger reflects that fact by highlighting the "breaking" instruction on the debug display window.

Figure 1:
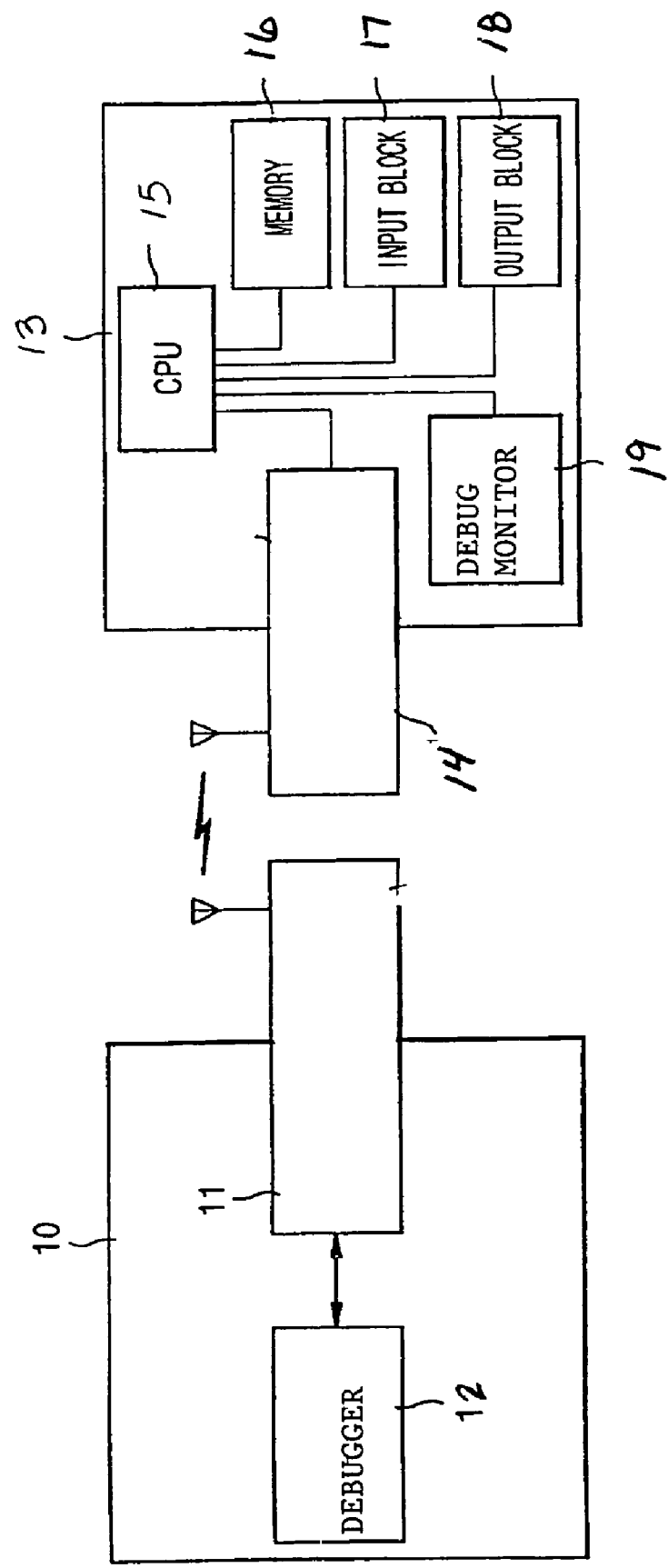
FIG. 1 is an exemplary block diagram of a system for firmware debugging of a wireless device.

FIG. 1 is a block diagram of a system for firmware debugging of a wireless device such as, a Bluetooth device, according to an embodiment of the invention. A host computer 10 includes a Bluetooth (BT) communication interface 11 for executing wireless communication and a debugger 12 for transmitting debugging commands to the wireless device 13 (target device) and controlling the debugging of the target device 13.

Target device 13 includes a BT communication interface 14 for receiving data from host 10 and a debug monitor 19. Target device 13 also includes a CPU 15, a memory 16, an input block 17, and an output block 18. Memory 16 includes a ROM for storing firmware executed by the CPU and a RAM. The BT communication interface 14 is coupled to CPU 15 and receives debugging commands from debugger 12 for execution on CPU 15. Further, the debugger, through the host 10, transmits a debug mode change command, which requests target device 13 to stop the execution of an application program by CPU 15. Upon receipt of the debug mode change command from the debugger, CPU 15 executes a procedure and transfers control to debug monitor 19.

Debug monitor program 19 is a small amount of code that resides in target device 13 ROM, within memory 16 to provide control and observation of CPU 15 and on-board peripherals, if any. The monitor software provides basic test and debug functions such as the setting of break points and inspection/modification of the CPU registers when the CPU has been halted. The debug monitor can typically remain with the product (embedded device) to provide maintenance functions.

In operation, CPU 15 receives a communication channel allocation-request signal transmitted from the host computer 10, and then judges if the wireless communication can be established in the current condition of CPU 15. If the wireless communication is established, CPU 15 transmits a message allowing wireless access. Memory 16 includes a (RAM) space for storing and executing the application program, which can be downloaded from the host computer via the wireless communication link. Input block 17 and output block 18 are used for the operation of the target device 13. The target device maybe a wireless keyboard, mouse, printer, other wireless peripherals, and the like.

Figure 2:
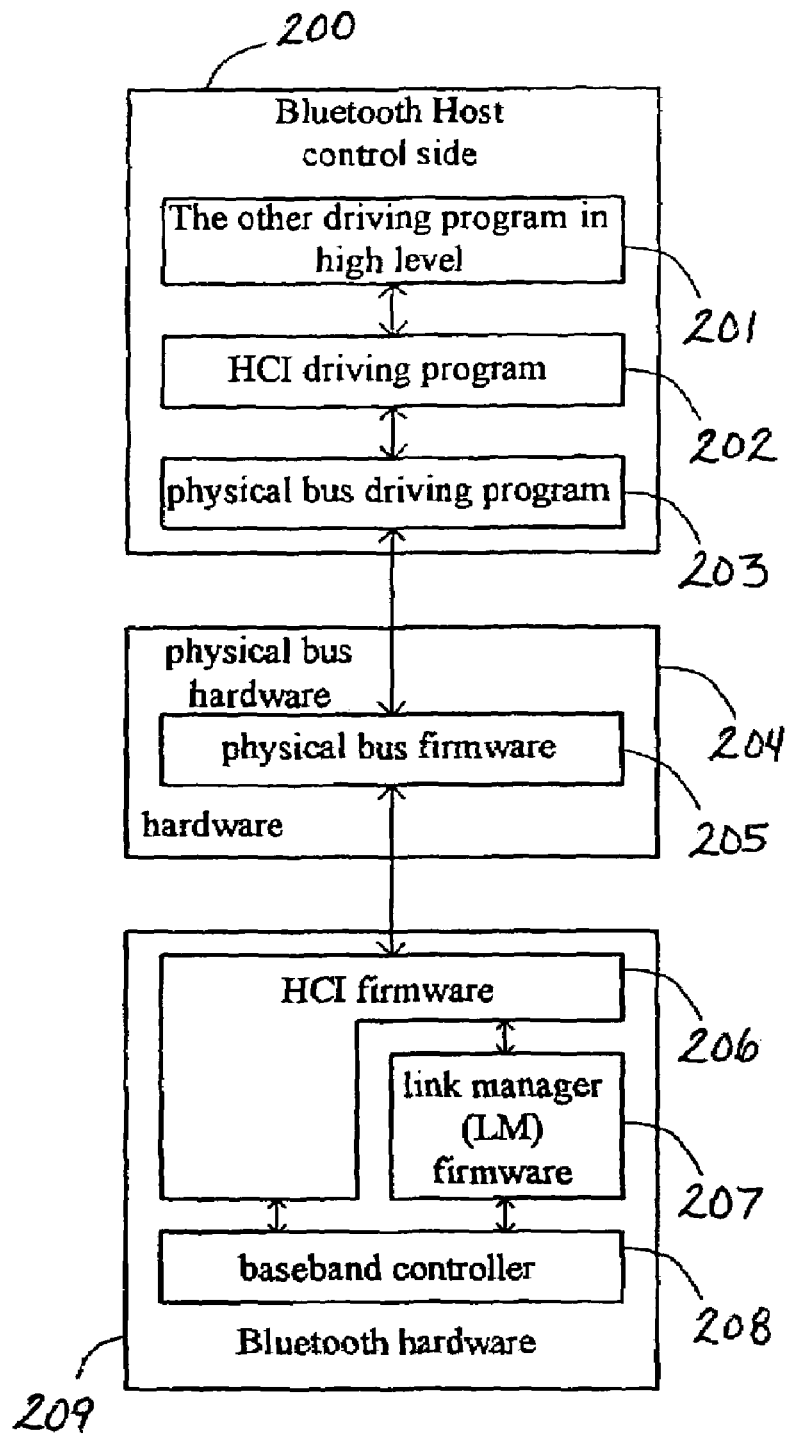
FIG. 2 illustrates an architecture of Bluetooth wireless communication protocol.

FIG. 2 illustrates an architecture of Bluetooth wireless communication protocol. A physical bus hardware 204 connects the Bluetooth host 200 and the Bluetooth hardware 209. The structure of the Bluetooth hardware 209 includes a baseband controller 208, a host controller interface (HCI) firmware 206, and a link manager (LM) firmware 207. During the wireless transmission, the host controller interface firmware 206 encodes the received data into a format of HCI packet, and the HCI packet is further fed into the Bluetooth host 200 via a physical bus firmware 205. Different functions can be performed under the Bluetooth system, after the HCI packet has been sequentially processed by a physical bus driving program 203, the HCI driving program 202 and other driving program 201.

Figure 3:
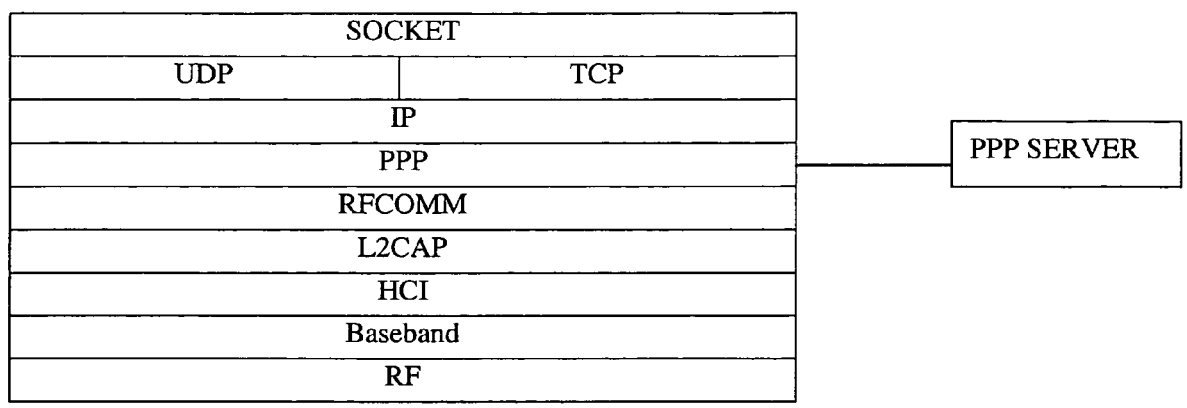
FIG. 3 shows a Bluetooth protocol stack.

FIG. 3 shows a Bluetooth protocol stack constructed hierarchically from the bottom layer in order of radio frequency (RF), baseband, host controller interface (HCI), logical link control and adaptation protocol (L2CAP), RFCOMM, point-to-point protocol (PPP), Internet Protocol (IP), transmission control protocol (TCP)/user datagram protocol (UDP), and socket.

The RF layer corresponds to the physical layer of the Open Systems Interconnection (OSI) framework. Similar to the RF layer, the baseband layer corresponds to the physical layer that establishes a physical connection. The HCI layer is an interfacing protocol between a Bluetooth module and a host. The L2CAP layer corresponds to the data link layer of the OSI, and is a protocol stack for interfacing a lower layer protocol stack with an upper layer application. The L2CAP layer has a similar role as the TCP layer of the Internet Protocol (IP). The L2CAP layer is a layer located above the HCI layer for enabling the upper layer protocol or application for exchanging data packets.

The RFCOMM layer is an emulator for serial communications and a protocol replacing serial communication protocols such as the RS-232C interface. The PPP layer is a protocol for serial communication between two computers. The IP is an Internet communication protocol. The TCP is a protocol used with the IP for transmitting data in a message form on the Internet. The UDP is a communications protocol providing limited services when messages are communicated using the IP. The UDP is an alternative to the TCP, and when used with the IP, is also referred to as UDP/IP.

Similar to the TCP, the UDP uses the IP to enable a computer to receive an actual data unit (datagram) from the another computer. The socket is a communications method between a client program and a server program on a network. The socket is typically referred to as "the end part of an access". The socket is sometimes referred to as an application programming interface (API) and is generated and utilized by a series of programming requests or function calls.

Figure 4:
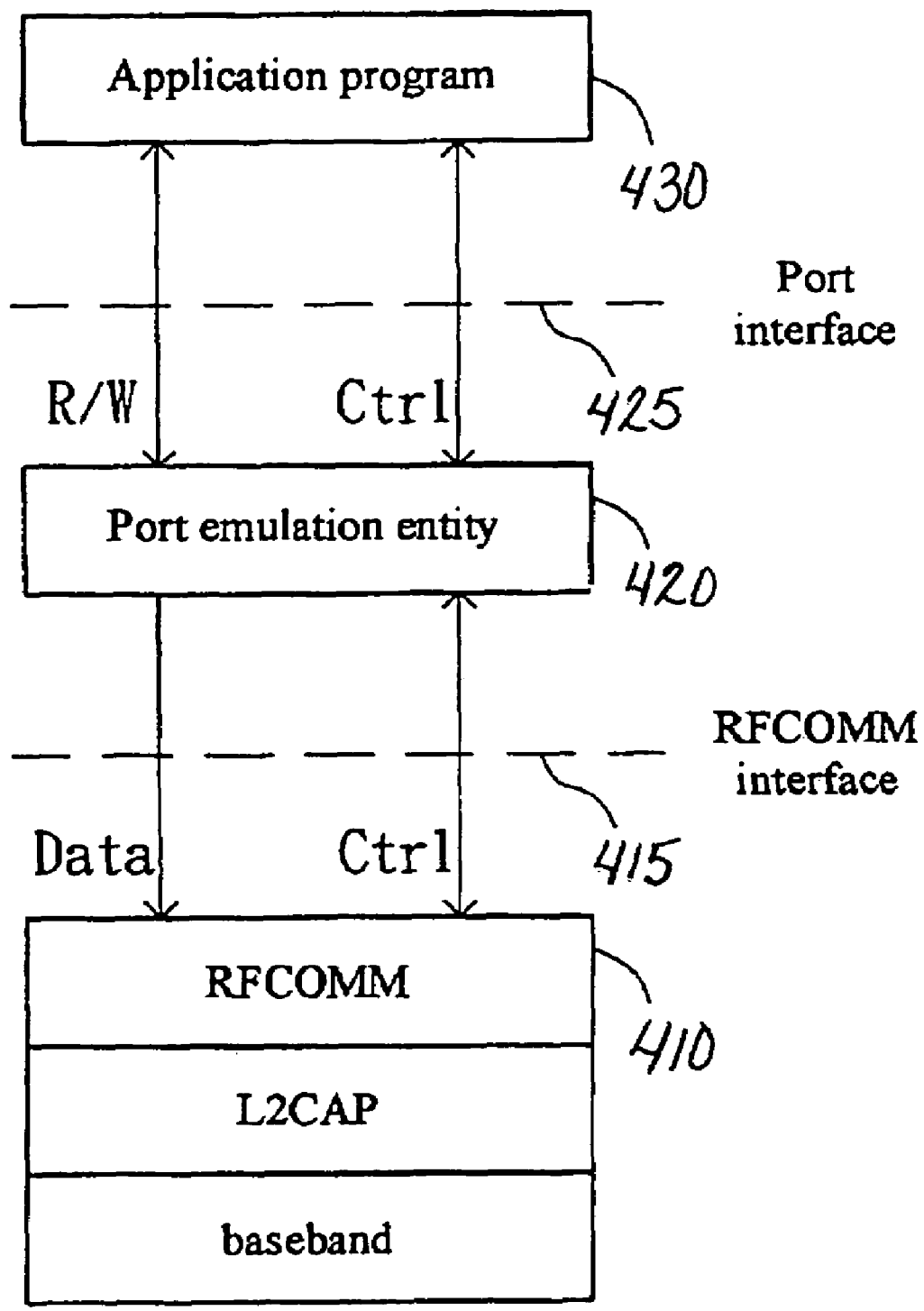
FIG. 4 depicts an exemplary scenario for the RFCOMM in the Bluetooth system to emulate a RS 232 serial port.

FIG. 4 depicts an exemplary scenario for the RFCOMM in the Bluetooth system to emulate a serial port, for example, a RS232 interface. The wireless communication interface 14 of target device 13 in FIG. 1, includes RFCOMM transmission device 410 that can use the port emulation entity 420 to transmit the data to the host 10 to be processed by the debugger 430. The RFCOMM transmission device 410 can use the RFCOMM interface 415 and the port emulation entity 420 for transmitting the data. The control signal between the two elements can be used to set the usual control parameters and the port parameters. Additionally, the port emulation entity 420 is capable of performing reading, writing, and control functions by utilizing the port interface 425. The port interface 425 maybe a virtual common port (VCOMM), for example. In one embodiment, the port interface 425 includes a hardware receive FIFO for receiving and storing data, and a hardware transmit FIFO for storing the data to be transmitted.

Figure 5:
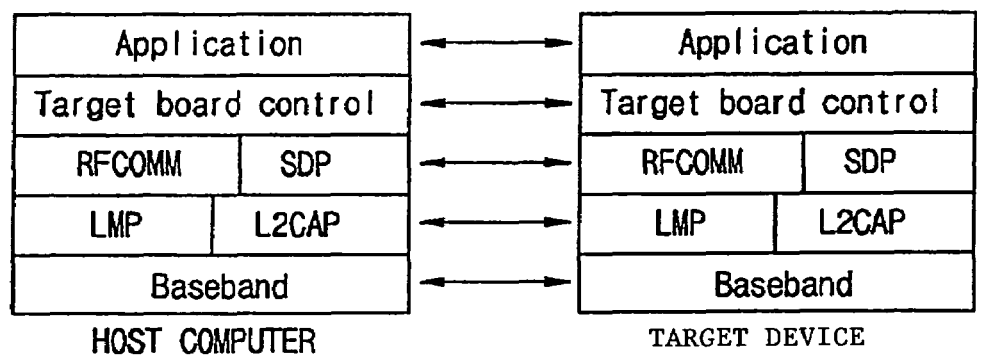
FIG. 5 depicts example profiles of Bluetooth protocol stacks for executing firmware debugging, according to one embodiment of the present invention.

FIG. 5 depicts example profiles of Bluetooth protocol stacks for executing firmware debugging using the Bluetooth. Bluetooth protocol stacks such as the HCI, the L2CAP and the RFCOMM and the profiles may respectively be realized inside the device drivers, the debugger, the kernel and the like of the host computer 10 as well as, the monitor program, the application program, and the like of the target device 13. A target device control is layered on the each Bluetooth protocol stack including a baseband, an LMP/L2CAP, an RFCOMM/SDP and the like for debugging between the target board and the host computer, and thus debugging is executed based upon such protocols.

Figure 6:
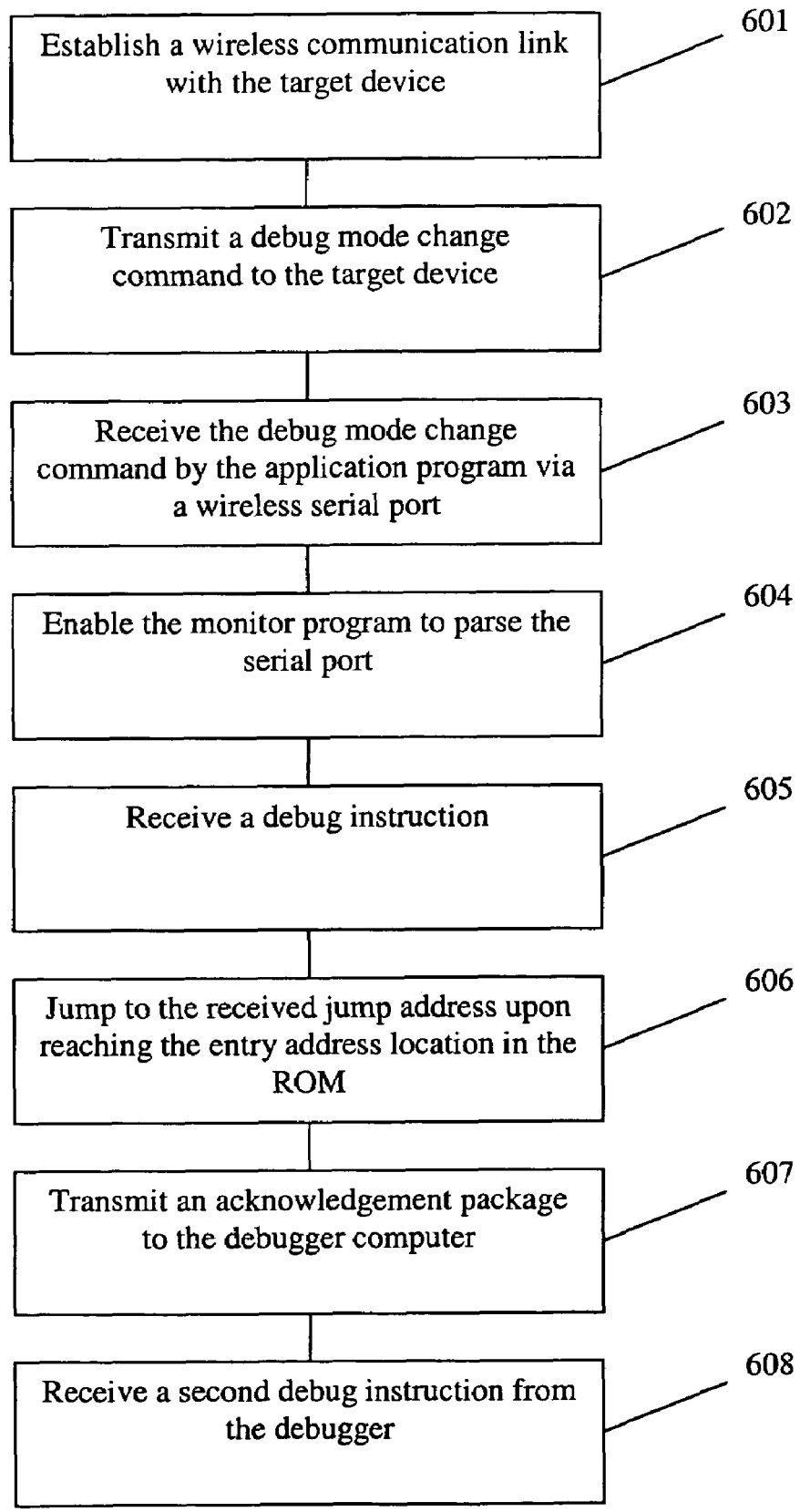
FIG. 6 is an exemplary process flow for debugging a ROM storing firmware in a wireless target device, according to one embodiment of the present invention.

FIG. 6 is an exemplary process flow for debugging a ROM storing firmware in a wireless target device. The wireless target device runs an application program and includes a debug monitor program. In block 601, a wireless communication link with the target device is established by a host computer.

In one embodiment, host computer 10 will do a feature request on the remote device to find out whether the device can support remote ROM debug. Then, the host computer is required to inform (or instruct) the target device 13 that it intends to occupy the target device for executing the debug routines.

In block 602, a debug mode change command is transmitted from the host to the target device. The debug mode change command is received by the application program running in the target device via a wireless serial channel in the target device, as shown in block 603. Upon receipt of the debug mode change command, the monitor program is enabled to parse the serial port. This may be accomplished by the monitor program calling a parser in the target device, a code section such as, a parser subroutine and a simplified version of a RFCOMM module within the monitor program. In other words, the monitor program that is running on the CPU is extended to include code that performs the reading and parsing of the serial data which contains the debug command that is sent over the air. Specifically, the monitor program includes a jump instruction to the code that performs reading from a receive hardware FIFO, interprets the RFCOMM serial command from the debugger, performs read/write to hardware register/memory locations, stores results, for example the content of a memory location, to a transmit FIFO, and instructs the transmit of the result packet back to the host, etc.

In one embodiment, the above functions are implemented in a hardware state machine. In this implementation, a hardware module includes a state machine for issuing memory/register content inquiries. The hardware module interacts with the monitor to exchange data received from the host and date to be transmitted to the host, without requiring the application program to be running. When the break point in application code is hit, the monitor program enables the hardware state machine to parse and check the content of the received packet from the host, such that the received packet is not passed on up to the RFCOMM profile anymore. In one embodiment, the hardware state machine emulates the RFCOMM profile in hardware. After recognizing the incoming debug command (for example, a memory peek at location 0x7000) from the host, the hardware state machine sends the memory peek request at location 0x7000 to the monitor program which then peeks the content at memory location 0x7000 and returns a packet with that content to the host.

Alternatively, the RFCOMM module part of the application program may be called by the monitor program. This scheme allows receiving and processing of the commands from the host, while the target is in the debug mode and the application program in the target is stopped. Since the parser parses the various debug commands, it needs to be independent of the application program, which may be halted at times.

In block 604, a debug instruction from the debugger in the host computer is received by the target device. The debug instruction is parsed and decoded by the parser and passed to the monitor program. In one embodiment, the debug instruction includes an entry address and a jump address. The entry address is the start address of the ROM that the debugger wants to 'break' away. The jump address is the address of the start of the monitor program. In one embodiment, the debug instruction also includes a return address, which is typically the next address to the entry address in the ROM code.

The monitor program control then jumps to the received jump address upon reaching the entry address location (that is, the start address of the ROM location that the debugger wants to debug) in the firmware, as depicted by block 605. The application program is running through the jump instruction. The jump instruction is part of the application program or more accurately, the patched code. Initially, only the monitor program is running when entering in debug mode. Then, when the monitor program receives a "run application" command from the host, it jumps to the start of the application code and starts executing the application code. Since the patch entry has been entered at this point for a break command for example, it is time to run the application code to see if the break point is hit.

In block 606, the target device transmits an acknowledgement package to the debugger in the host computer and receives a second debug instruction from the debugger, responsive to the acknowledgement package. The acknowledgement package indicates that the firmware stored in the ROM has reached the break point, therefore, it is a break acknowledgement. After the acknowledgement, the debugger can transmit any instruction to the monitor program for status/memory content inquiry, etc.

Figure 7:
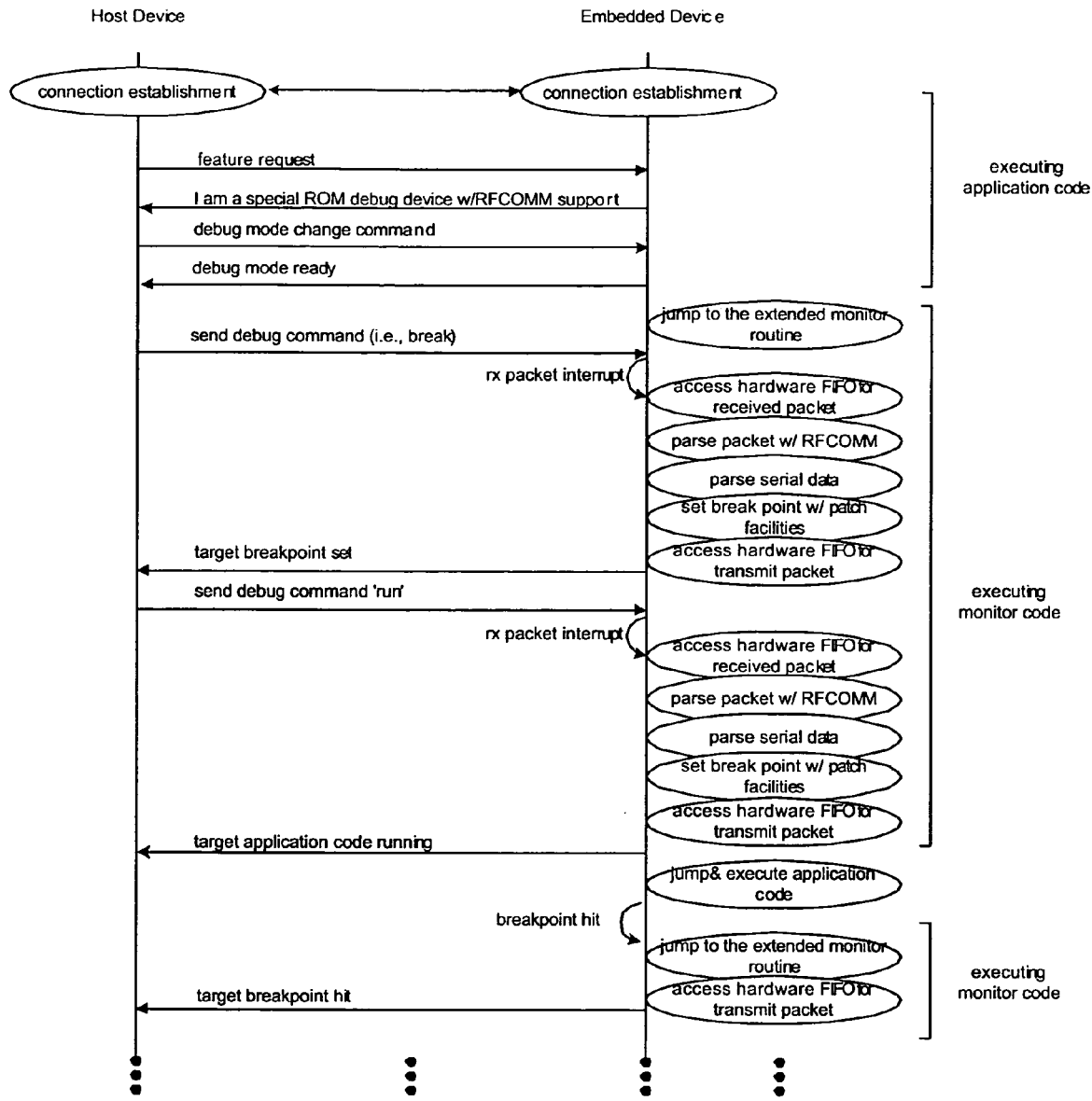
FIG. 7 is an exemplary process diagram showing interaction between a host and a target device during a debug session, according to one embodiment of the present invention.

FIG. 7 is an exemplary process diagram illustrating interaction between a host and a target device during a debug session, according to one embodiment of the present invention. As depicted, once the wireless connection is established and the embedded device is running the application code, the host sends a "feature request" message to the embedded target device. In response, the device sends a message back to the host indicating that the device is a special ROM debug device which includes RFCOMM support. Once the target device is identified as a special ROM debug device, the host sends a debug mode change command and the device acknowledges its readiness for debug mode.

Once the device receives a debug command, such as a break point command, the device firmware code jumps to an extended monitor routine and accesses a hardware FIFO for received packet. The device then parses the received packet with RFCOMM and sets a break point with ROM patch facilities. ROM patch facilities works like the well known process of patching a ROM to correct data stored in the ROM. That is, rather than reading data from a specific location in the ROM, the program counter is pointed to a location which includes the new (corrected) data. The target device then sends a "target break point set" message back to the host.

The host sends another debug command ("run") to the target device and the target device goes through similar routines describes above to send a "target application code running" message back to the host. The target device then executes the application code until the break point is hit. Once the break point is hit, the device jumps to the extended monitor routine and accesses the hardware FIFO for transmit packet. In one embodiment, the hardware state machine emulating the RFCOMM profile in hardware is implemented using a state diagram shown by the states represented by "bubbles" in FIG. 7.

It will be recognized by those skilled in the art that various modifications may be made to the illustrated and other embodiments of the invention described above, without departing from the broad inventive scope thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A method for debugging a read only memory (ROM) in a wireless target device running an application program and including a debug monitor program, the method comprising:
   establishing a wireless communication link with the target device by a host computer;
   transmitting a debug mode change command to the target device;
   receiving the debug mode change command by the application program via a wireless serial port in the target device;
   enabling the monitor program to parse the serial port;
   receiving a debug instruction from a debugger in the host computer by the monitor program, wherein the debug instruction includes an entry address and a jump address;
   jumping to the received jump address upon reaching the entry address location in the application program;
   transmitting an acknowledgement package to the debugger in the host computer; and
   receiving a second debug instruction from the debugger, responsive to the acknowledgement package.

2. The method of claim 1, wherein the wireless target device is a Bluetooth enabled device.

3. The method of claim 2, wherein the serial port is the RFCOMM channel of the Bluetooth enabled device.

4. The method of claim 1, wherein the wireless target device is a wireless keyboard.

5. The method of claim 1, wherein the wireless target device is a wireless mouse.

6. The method of claim 1, wherein the enabling the monitor program to parse the serial port comprises enabling a portion of the application program to parsing the serial port.

7. A method for debugging a read only memory (ROM) in a wireless target device running an application program and including a debug monitor program, the method comprising:
   establishing a wireless communication link with the target device by a host computer;
   transmitting a debug mode change command to the target device;
   receiving the debug mode change command by the application program via a wireless serial port in the target device;
   enabling a parser for parsing the serial port, wherein the parser is independent of the application program;
   receiving a debug instruction from a debugger in the host computer by the monitor program, wherein the debug instruction includes an entry address and a jump address;
   jumping to the received jump address upon reaching the entry address location in the application program;
   transmitting an acknowledgement package to the debugger in the host computer; and
   receiving a second debug instruction from the debugger, responsive to the acknowledgement package.

8. The method of claim 7, wherein the parser is part of the monitor program.

9. The method of claim 7, wherein the parser uses a portion of the application program for parsing the serial port.

10. The method of claim 7, wherein the parser parses the serial port by operating a state machine.

11. The method of claim 10, wherein the wireless target device is a Bluetooth enabled device and the state machine emulates RFCOMM profile of the Bluetooth enabled device.

12. The method of claim 7, wherein the wireless target device is a wireless keyboard.

13. The method of claim 7, wherein the wireless target device is a wireless mouse.

14. A system for debugging a read only memory (ROM) in a wireless target device running an application program and including a debug monitor program comprising:
   means for establishing a wireless communication link with the target device by a host computer;
   means for transmitting a debug mode change command to the target device;
   means for receiving the debug mode change command by the application program via a wireless serial port in the target device;
   means for enabling a parser for parsing the serial port, wherein the parser is independent of the application program;
   means for receiving a debug instruction from a debugger in the host computer by the monitor program, wherein the debug instruction includes an entry address and a jump address;
   means for jumping to the received jump address upon reaching the entry address location in the application program;
   means for transmitting an acknowledgement package to the debugger in the host computer; and
   means for receiving a second debug instruction from the debugger, responsive to the acknowledgement package.

15. The system of claim 14, wherein the parser is part of the monitor program.

16. The system of claim 14, wherein the parser uses a portion of the application program for parsing the serial port.

17. The system of claim 14, wherein the parser includes a state machine to pars the serial port.

18. The system of claim 17, wherein the wireless target device is a Bluetooth enabled device and the state machine includes means for emulating RFCOMM profile of the Bluetooth enabled device.

19. The system of claim 14, wherein the wireless target device is a wireless keyboard.

20. The system of claim 14, wherein the wireless target device is a wireless mouse.

* * * * *